United States Patent
Jin et al.

(10) Patent No.: US 7,355,880 B1
(45) Date of Patent: Apr. 8, 2008

(54) SOFT ERROR RESISTANT MEMORY CELL AND METHOD OF MANUFACTURE

(75) Inventors: Bo Jin, Campbell, CA (US); Ahmad Chatila, San Jose, CA (US); Kaichiu Wong, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 31 days.

(21) Appl. No.: 10/823,529

(22) Filed: Apr. 13, 2004

Related U.S. Application Data (60) Provisional application No. 60/463,430, filed on Apr. 16, 2003.

(51) Int. Cl.
*G11C 11/24* (2006.01)

(52) U.S. Cl. .................. 365/154; 365/149; 365/205; 257/903; 438/239

(58) Field of Classification Search .............. 365/154, 365/156, 149, 205; 257/393, 296, 903, 292, 257/E21.661, E27.098; 438/154, 239, 396, 438/FOR. 430
See application file for complete search history.

(56) References Cited

U.S. PATENT DOCUMENTS

| | | | |
|---|---|---|---|
| 5,780,910 A * | 7/1998 | Hashimoto et al. ......... 257/393 |
| 5,798,551 A * | 8/1998 | Kikushima et al. ......... 257/368 |
| 6,104,053 A * | 8/2000 | Nagai ......................... 257/303 |
| 6,504,788 B1 | 1/2003 | Nil et al. |
| 6,693,820 B2 | 2/2004 | Nil et al. |
| 6,696,873 B2 | 2/2004 | Hazucha et al. |
| 6,750,113 B2 * | 6/2004 | Armacost et al. ........... 438/396 |

* cited by examiner

*Primary Examiner*—David Lam
(74) *Attorney, Agent, or Firm*—Haverstock & Owens, LLP (57) ABSTRACT

A semiconductor device memory cell (100) can include a built-in capacitor for reducing a soft-error rate (SER). A memory cell (100) can include a first inverter (102) and second inverter (104) arranged in a cross-coupled configuration. A capacitor (110) can be coupled between a first storage node (106) and second storage node (108). A capacitor (110) can be a "built-in" capacitor formed with interconnect wirings utilized to connect memory cell circuit components.

9 Claims, 7 Drawing Sheets

SOFT ERROR RESISTANT MEMORY CELL AND METHOD OF MANUFACTURE

This application claims the benefit of U.S. provisional patent application Ser. No. 60/463,430, filed Apr. 16, 2003.

TECHNICAL FIELD

The present invention relates generally to integrated circuits and, more particularly to a circuit for reducing a soft-error rate in a semiconductor memory device, and a method of manufacturing such a circuit.

BACKGROUND OF THE INVENTION

Semiconductor memory devices are typically manufactured with circuits, such as redundancy circuits, to address defects that can arise from uncontrollable manufacturing process variations, and the like. Unfortunately, semiconductor memory devices are still vulnerable to errors that may arise out of the operating environment and conditions, such as "soft" errors.

"Soft" errors are random errors that can appear in a memory device that are not related to any defect. Soft errors are most often attributed, either directly or indirectly, to sub-atomic particles. More particularly, many soft errors are believed to result from alpha particles traveling through a semiconductor substrate and generating electron hole pairs. Alpha particles may be generated by the decay of elements (e.g., uranium, thorium) or cosmic ray events, for example.

In a soft-error event, generated electron hole pairs can cause a change in state of the data stored within a memory device. For example, in the case of a dynamic random access memory (DRAM) type cell, generated electron hole pairs may result in loss of charge from a storage capacitor. In the case of a latch-based static RAM (SRAM) type cell, the cell may "flip", resulting in the opposite logic value being stored. Soft errors in semiconductor devices are often described in terms of a soft-error rate (SER). An SER can be an indication of an integrated circuit's degree of susceptibility to soft-error events.

One way of reducing the SER in DRAM devices can be to increase the capacitance of a storage cell. However, this approach has disadvantages that may include increased current consumption and/or larger memory cell sizes.

Other approaches to reducing the SER of semiconductor devices include forming a thick polymer coating and/or a phosphosilicate glass (PSG) type of layer on top of the device. Such a coating may act to absorb some soft-error particles before they can impact the memory cells. Also, materials used to package devices may be manufactured to have low levels of radioactive impurities so as to reduce the possible sources of unwanted particles.

Unfortunately, as semiconductor memory devices continue to shrink in size, the number of electron hole pairs necessary to induce a soft error can be correspondingly smaller. Thus, it remains a continuing goal to reduce the soft error rate (SER) of semiconductor memory devices.

SUMMARY OF THE INVENTION

The present invention can include a memory cell having a first node for storing a first potential and a second node for storing a second potential. In addition, the memory cell can include a capacitor having plates coupled between the first node and second node. A portion of at least one plate of the capacitor can be formed from a first interconnect wiring that interconnects circuit components of the memory cell.

The inclusion of a capacitor between data storage nodes can increase a memory cell resistance to soft error events (i.e., reduce a soft error rate).

According to one aspect of the embodiments, a memory cell may further include a first inverter having an input coupled to the first node and an output coupled to the second node. In addition, a second inverter can have an input coupled to the second node and an output coupled to the first node. A first node can store a true data value and a second node can store a complementary data value.

In this way, a memory cell may include complementary data nodes. Such an arrangement may be particularly applicable to higher speed memory devices, such as static random access memories (SRAMs), dual port RAMs, and content address memories (CAMs), to name just a few.

According to another aspect of the embodiments, a memory cell may further include a first access transistor coupled to the first node, and a second access transistor coupled to the second node.

Such an arrangement can allow for access to both data nodes.

According to another aspect of the embodiments, a memory cell may further include transistor gates formed from a gate layer and a first conductive interconnect wiring formed over the gate layer. A first conductive interconnect wiring can includes a plurality of conductive layers, at least one of the conductive layers forming a portion of a first plate of the capacitor.

In this way, a capacitor can be formed from memory cell wiring utilized to connect memory cell circuit components. Such an arrangement may advantageously utilize existing structures within a memory cell.

According to another aspect of the embodiments, a first conductive interconnect wiring can include a bottom conductive layer, a dielectric layer formed over the bottom conductive layer, and a top conductive layer formed over the dielectric layer. The top conductive layer can form at least a portion of a first plate of the capacitor.

In this way, a first conducive interconnect wiring can advantageously include a built-in capacitor dielectric.

According to another aspect of the embodiments, a second conductive interconnect wiring can be formed over the first conductive interconnect wiring. The second conductive wiring can form at least a portion of a second plate of the capacitor.

According to another aspect of the embodiments, a second conductive interconnect wiring can include titanium. Further, a top conductive layer of the first conductive interconnect wiring can include titanium, and a bottom conductive layer of the first conductive interconnect wiring can include titanium nitride.

The present invention may also include a method of forming a capacitor in an integrated circuit. The method can include depositing an insulating layer over a plurality of capacitor structures. Each capacitor structure can include a dielectric layer disposed between a first interconnect layer and a second interconnect layer. The method may also include forming a recess in the insulating layer according to a capacitor mask pattern. Such a recess can expose a second interconnect layer of at least two capacitor structures. A third interconnect layer can then be formed within the recess that is in electrical contact with the exposed second interconnect layers of the at least two capacitor structures.

According to another aspect of the embodiments, an insulating layer can include silicon oxide.

According to another aspect of the embodiments, a third interconnect layer can include titanium.

According to another aspect of the embodiments, a method may further include, prior to depositing the insulating layer, forming a first interconnect layer, forming a dielectric layer over the first interconnect layer, and forming a second interconnect layer over the dielectric layer. An etching can then be performed that etches through the first interconnect layer, the dielectric layer, and the second interconnect layer to form capacitor structures.

In this way, a first interconnect layer can be patterned to form, not only an interconnect pattern, but capacitor structures as well. The capacitor structures can subsequently be connected to form a built-in capacitor for a circuit, such as a memory cell.

According to another aspect of the embodiments, a first interconnect layer can comprise titanium nitride, and a second interconnect layer can comprise titanium.

According to another aspect of the embodiments, a method may further include, after forming the capacitor structures, depositing a spacer insulating layer over the capacitor structures, and anisotropically etching the spacer insulating layer to form insulating spacers on side surfaces of the capacitor structures.

In this way, a spacer can be formed that can isolate a bottom layer of a first interconnect wiring from a top layer. Such an arrangement can make it easier to make a conductive connection with a top conductive layer while maintaining electrical isolation from a bottom conductive layer of the interconnect wiring.

According to another aspect of the embodiments, a step of forming a recess in the insulating layer can include etching a portion of the first insulating layer. In addition, after forming the third interconnect layer, a chemical-mechanical polishing can remove portions of the third interconnect layer outside of the recess.

In this way, a remaining portion of a third interconnect layer can form a capacitor plate portion that is self-aligned with respect to the recess.

The present invention may also include a method of forming an integrated circuit memory cell. Such a method can include forming a first interconnect wiring that electrically connects a plurality of transistor gates to transistor diffusion regions, the first interconnect wiring pattern can include at least one dielectric layer between top and bottom conductive layers. The method may also include forming a second interconnect layer over the first interconnect wiring that is in electrical contact with the top conductive layers to form a capacitor. The capacitor can include a first plate comprising the top conductive layer, a second plate comprising the second interconnect layer, and a capacitor dielectric comprising the at least one dielectric layer.

In this way, a capacitor can be formed for a memory cell that advantageously incorporates a first interconnect wiring pattern.

According to another aspect of the embodiments, forming a first interconnect wiring can include forming the bottom conductive layer having a thickness of no more than about 1000 angstroms, forming a dielectric layer having a total thickness of less than about 80 angstroms, and forming a top conductive layer having a thickness of no more than about 300 angstroms. The method may also include etching through the bottom conductive layer, at least one dielectric layer and the top conductive layer according to a first wiring pattern.

According to another aspect of the embodiments, a method may also include forming insulating sidewalls on the sides of the first interconnect wiring.

According to another aspect of the embodiments, forming insulating sidewalls can also include depositing a layer of silicon nitride having a thickness of no more than about 500 angstroms, and anisotropically etching the layer of silicon nitride.

According to another aspect of the embodiments, a first interconnect wiring can include a first wiring portion that electrically connects the gate of a first memory cell transistor to a source/drain region of a second memory cell transistor, and a second wiring portion that electrically connects a gate of the second memory cell transistor to a source/drain region of the first memory cell transistor.

According to another aspect of the embodiments, first and second wiring portions can be formed on an interconnect insulator layer. A first wiring portion can be electrically connected to the gate of the first memory cell transistor by a first local contact that extends through the interconnect insulator layer. A second wiring portion can be electrically connected to the gate of the second memory cell transistor by a second local contact that extends through the interconnect insulator layer.

DETAILED DESCRIPTION

Various embodiments of the present invention will now be described in detail with reference to a number of drawings. The embodiments include a memory cell circuit having a capacitor for reducing a soft error rate, as well as a method of manufacturing such a capacitor.

Figure 1:
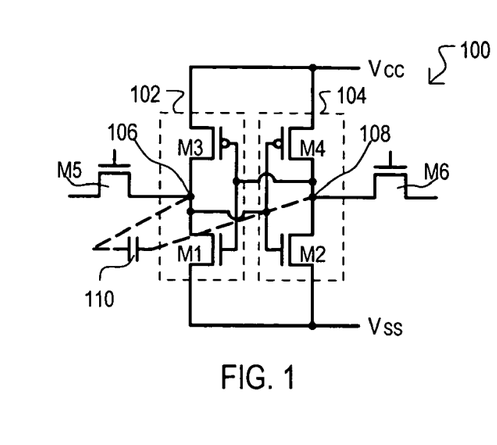
FIG. 1 is a schematic diagram of a first embodiment of the present invention.

A first embodiment of the present invention includes a memory cell and is set forth in FIG. 1 and designated by the general reference character 100. A first embodiment 100 can include a memory cell having a built-in capacitor for increasing a capacitance between data storage nodes. Such an increased capacitance can reduce a soft-error rate (SER) by improving a node's resistance to being charged/discharged in response to a soft error event (e.g., spontaneous generation of electron-hole pairs). In the very particular example of FIG. 1, a memory cell can include a static random access memory (SRAM) type memory cell. However, the present invention should not necessarily be construed as being limited to any particular type of memory cell.

Referring to FIG. 1, a first embodiment 100 can include a first inverter 102 and second inverter 104 arranged in a cross-coupled configuration, with an output of a first inverter 102 being connected to an input of a second inverter 104, and vice versa. In such an arrangement, a resulting SRAM cell can include a first storage node 106 for storing a first data value (a "true" value) and a second storage node 108 for storing a complementary data value. Thus, according to the data value being stored, a first storage node 106 will be at one potential (e.g., a high voltage) while a second storage node 108 will be at another potential (e.g., a low voltage).

Unlike conventional 6-T SRAM cells, a first embodiment 100 may further include a capacitor 110 coupled between first storage node 106 and second storage node 108. As noted above, storage nodes (106 and 108) can be at different potentials in operation. A capacitor 110 can help maintain such a potential difference in the event either storage node (106 and 108) is temporarily disturbed due to a soft error event. That is, a transient response at such nodes (dV/dt) would be slowed due to such a capacitance.

It is understood that a capacitor 110 may be composed of one set of opposing conductive layers separated by a dielectric, or may be composed of multiple such structures. That is, a capacitor 110 may physically include a single capacitor structure, or multiple capacitor structures arranged in parallel and/or in series.

As illustrated in FIG. 1, within inverter 102, gates of transistors M1 and M3 can be connected to a drain-drain connection between transistors M2 and M4. Such an interconnection can be accomplished by way of a local interconnect wiring. Similarly, gates of transistors M2 and M4 can be connected to a drain-drain connection between transistors M1 and M3 by such a local interconnect wiring. At the same time, the same interconnect wiring can form plates for capacitor 110.

More particularly, a capacitor 110 can have one plate connected to a gate of transistor M2 and transistor M4 of inverter 104 by way of an interconnect wiring. Another plate of capacitor 110 can be connected to a gate of transistor M1 and M3 of inverter 102 by such an interconnect wiring. Transistors M1 and M2 can be n-channel insulated gate field effect transistors (referred to herein generally as MOS transistors) and transistors M3 and M4 can be p-channel MOS transistors.

In this way, a capacitor 110 can be a "built-in" capacitor formed with interconnect wirings utilized to connect memory cell circuit components.

As will be described in more detail below, a local interconnect wiring can include a patterned layer in combination with local contacts. Such local interconnect layers may be disposed above a gate layer. Preferably, one plate of capacitor 110 can be formed from one interconnect layer, while another is formed from a different interconnect layer.

A first embodiment 100 further includes a first access transistor M5 connected to a first storage node 106 and a second access transistor M6 connected to a second storage node 108. Access transistors (M5 and M6) can provide access to data values stored within memory cell 100. Transistors M5 and M6 can be n-channel MOS transistors. In one particular arrangement, one or both of access transistors (M5 and M6) can connect the corresponding storage nodes (106 and 108) to bit lines (not shown in FIG. 1).

While the embodiment of FIG. 1 shows the present invention implemented in a six transistor static random access memory (SRAM), the present invention should not be limited to such an application. As but one example, a four transistor SRAM implementation is shown in FIG. 2.

Figure 2:
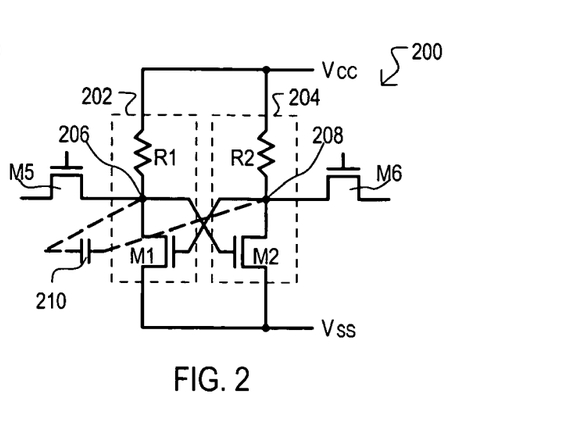
FIG. 2 is a schematic diagram of a second embodiment of the present invention.

FIG. 2 is a schematic diagram of a second embodiment of the present invention. FIG. 2 includes the same general components as FIG. 1. Accordingly, like components characters will be referred to by the same reference character, but with the first character being a "2" instead of a "1".

FIG. 2 differs from FIG. 1 in that p-channel transistors M3 and M4 are replaced by resistors R1 and R2.

Figure 3:
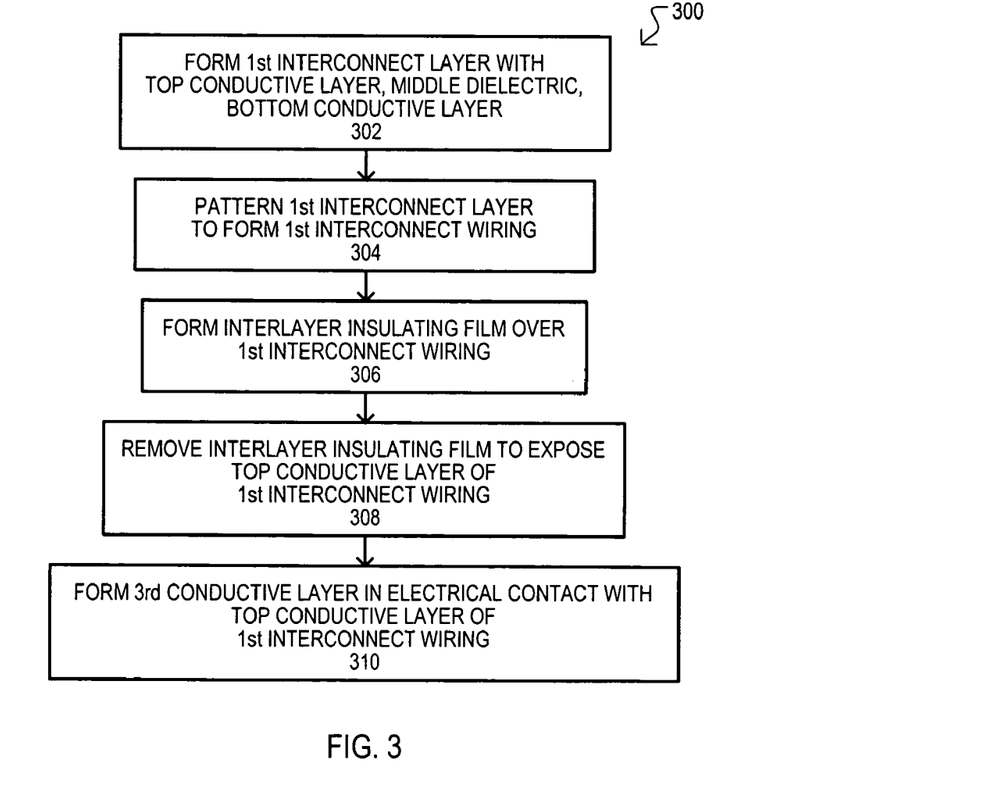
FIG. 3 is a flow diagram of a method of manufacturing a capacitor according to one embodiment of the present invention.

Having described particular arrangements of a memory cell with a built-in capacitor for reducing soft-errors, a method of manufacturing such a built-in capacitor will now be described with reference to FIGS. 3 and 4A to 4E. FIG. 3 is a flow diagram of a method for forming a built-in capacitor within a memory cell. FIGS. 4A to 4E are side cross sectional views of a portion of a semiconductor device illustrating the method of FIG. 3. In the following description, it is understood that "top", "bottom", "above", "below", "over", "under" and the like, are illustrative relative terms and should not be construed as limiting to particular device orientations or arrangements.

Referring now to FIG. 3, a method according to one embodiment is designated by the general reference character 300 can include forming a first interconnect wiring layer with a top conductive layer, middle dielectric layer and bottom conductive layer (step 302).

Figure 4A:
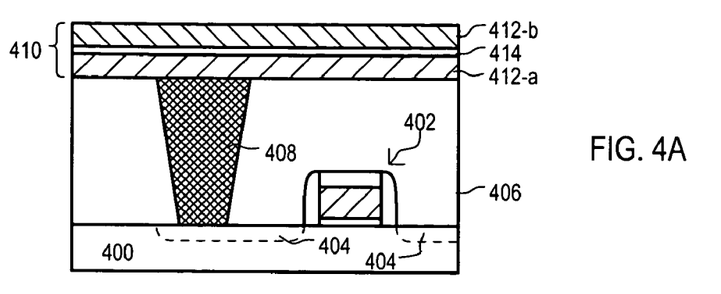
FIGS. 4A to 4E are side cross sectional views illustrating the method of FIG. 3.

One example of a semiconductor device following a step 302 is shown in FIG. 4A. A semiconductor device can include a substrate 400 in which memory cell circuit elements can be formed. Such elements may include, as but one example, transistor gate structures 402 and transistor source/drain regions 404. An interconnect insulating layer 406 may be formed over a substrate. A local contact 408 can extend through interconnect insulating layer to make electrical contact with memory cell circuit elements.

FIG. 4A also shows a first interconnect layer 410 formed over interconnect insulating layer 406. A first interconnect layer 410 can include a first conductive layer 412-*a*, a dielectric layer 414, and a second conductive layer 412-*b*. Thus, a first conductive layer 412-*a* can be a bottom layer, a dielectric layer 414 can be a middle layer, and a second conductive layer 412-*b* can be a top layer.

FIG. 4A shows that unlike conventional interconnect layers, which are composed only of one or more conductive layers, a first interconnect layer of the embodiment shown can include at least one dielectric layer sandwiched between conductive film. As will be described later, such a dielectric layer 414 can serve as a capacitor dielectric.

Referring back to FIG. 3, a method 300 can further include patterning a first interconnect layer to form a first interconnect wiring (step 304). It is understood that a first interconnect wiring can electrically interconnect memory cell circuit components.

Figure 4B:
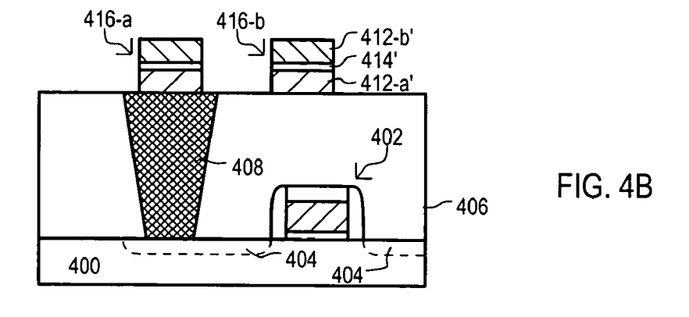

One example of a semiconductor device following a step 304 is shown in FIG. 4B. First interconnect wiring 410 has been patterned resulting in interconnect capacitor structures 416-*a* and 416-*b*. Interconnect capacitor structures (416-*a* and 416-*b*) can provide interconnection between memory cell circuit components. In addition, such structures may also form capacitor structures, including conductive plates 412-*a*' and 412-*b*' on either side of a dielectric 414'.

Figure 4C:
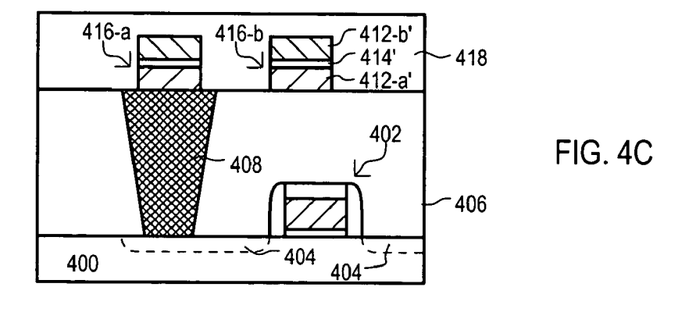

A method 300 can also include forming an interlayer insulating film over a first interconnect wiring (step 306). One example of a semiconductor device following a step 306 is shown in FIG. 4C. An interlayer insulating film 418 can be formed over interconnect capacitor structures (416-*a* and 416-*b*).

Figure 4D:
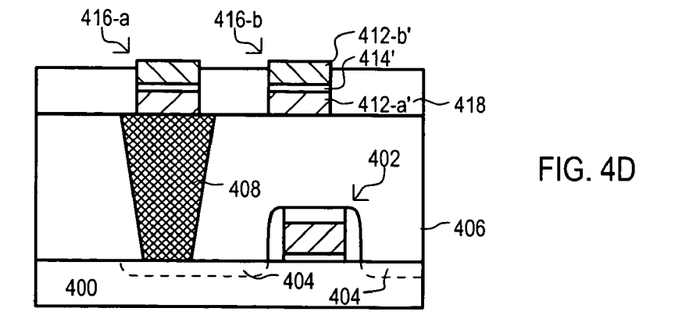

A method 300 can further include removing an interlayer insulating film to expose a top conductive layer of interconnect capacitor structures. One example of a semiconductor device following such a step is shown in FIG. 4D. Such a step can expose a top conductive layer 412-b' of interconnect capacitor structures (416-a and 416-b).

A method 300 can also include forming a third conductive layer in electrical contact with a top conductive layer of the first interconnect capacitor structures (step 310).

Figure 4E:
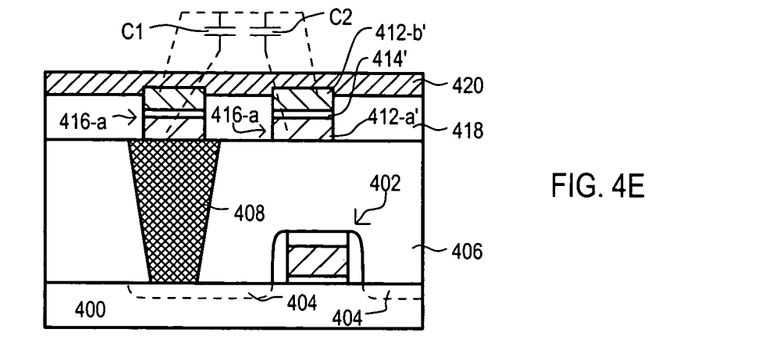

One example of a semiconductor device following such a step is shown in FIG. 4E. After such a step, a third conductive layer 420 can provide a common plate in conjunction with top conductive layer 412-b'. Resulting capacitors are shown as C1 and C2 in FIG. 4E. Such capacitors may be arranged in series or in parallel according to the configuration of interconnect capacitor structures (416-a and 416-b). In the particular example of FIG. 4E, capacitors C1 and C2 are connected in series.

In this way, a interconnect wiring (416-a and 416-b) can provide both interconnect functions as well as a built-in capacitor structures for a memory cell.

Figure 5:
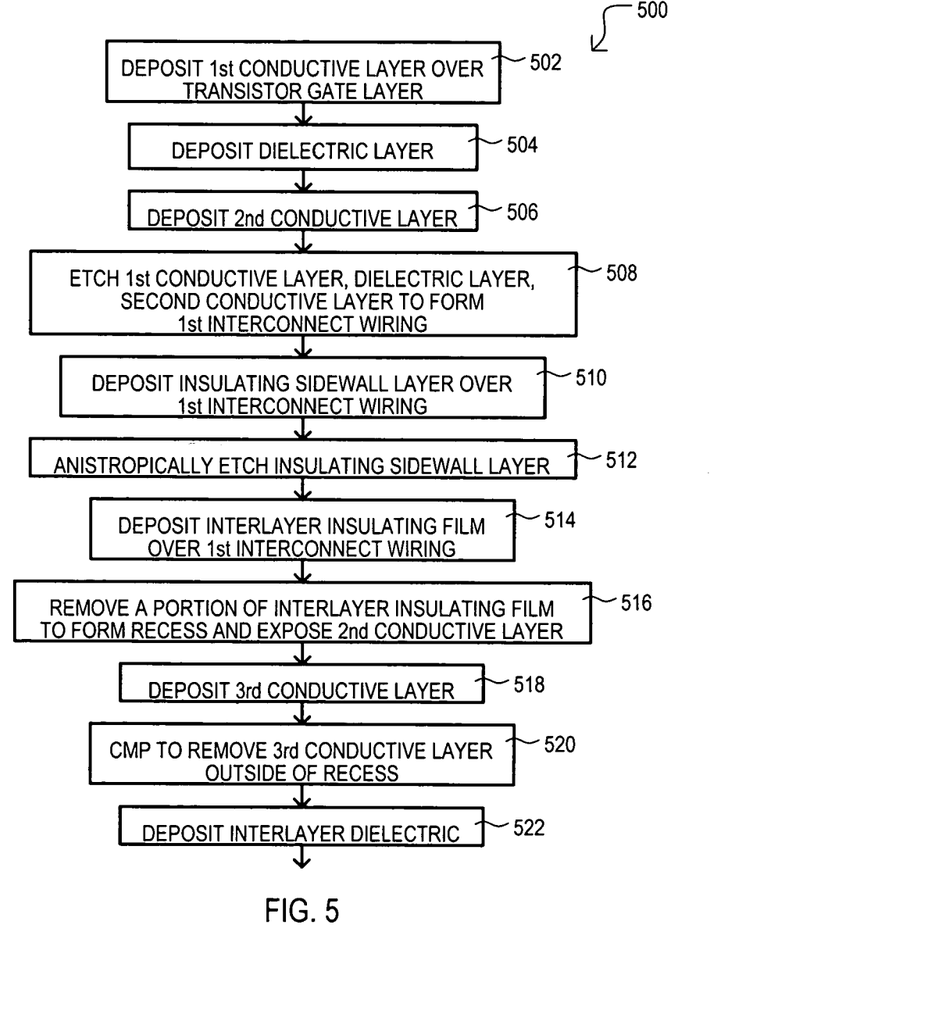
FIG. 5 is a flow diagram of another method of manufacturing a capacitor according to an embodiment of the present invention.

Having described one embodiment method, a second more detailed embodiment will now be described with reference to FIGS. 5 and 6A to 6K. FIG. 5 is a flow diagram of a method according to another embodiment. FIGS. 6A to 6K are side cross sectional views of a portion of a semiconductor device illustrating the method of FIG. 5. FIGS. 6A-6K illustrate the process steps and associated architecture that can be used to form a capacitor during the fabrication of a semiconductor device.

The method shown in FIG. 5 is designated by the general reference character 500 can include depositing a first conductive layer over a transistor gate layer (step 502).

Figure 6A:
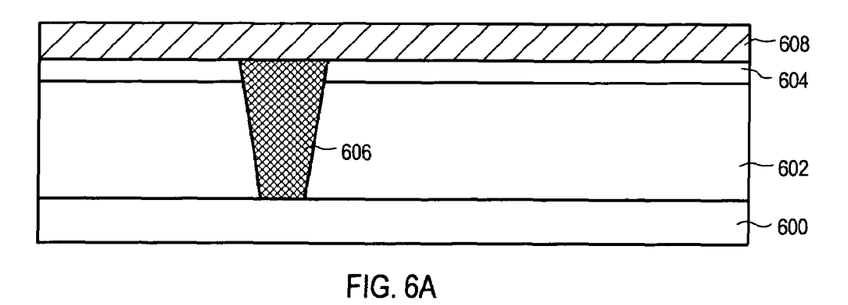
FIGS. 6A to 6K are side cross sectional views illustrating the method of FIG. 6.

Referring to FIG. 6A, prior to a step 502, a semiconductor device can include a silicon substrate 600. An interconnect insulating layer 602 can be formed over substrate 600. An interconnect insulating layer 602 may comprise silicon dioxide, preferably a phosphosilicate glass (PSG) layer. A "cap" insulating layer 604 can be formed on interconnect insulating layer 602. A cap insulating layer 604 may comprise silicon dioxide, preferably an undoped silicate glass (USG) layer. A local interconnect (LI) contact 606 can be formed through interconnect insulating layer 602 and cap insulating layer 604 to a substrate 600 (and/or transistor gate layer, not shown in FIGS. 6A-6K).

An LI contact 606 may provide an electrical connection between a memory cell circuit element (e.g., a transistor gate or source/drain region) and an overlying interconnect wiring.

Referring still to FIG. 6A, following a step 502, a first conductive layer 608 can be deposited on top of cap insulating layer 604. A first conductive layer 608 may serve as a first local interconnect layer, by providing a first conductive connection layer for circuit elements. A first conductive layer can include titanium nitride (TiN) deposited to a thickness within a range of about 100 angstroms (Å) to about 5000 Å, preferably about 1000 Å. Of course, while titanium nitride may have advantageous adhesion and diffusion barrier properties, a first conductive layer 608 should not be construed as being limited to any particular material.

A dielectric layer may then be deposited (step 504).

Figure 6B:
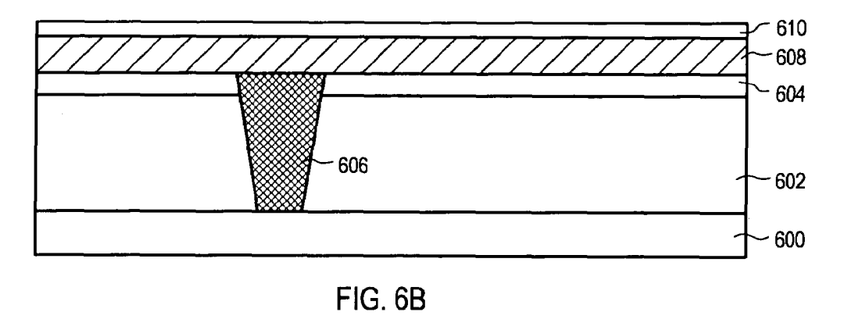

Referring to FIG. 6B, following a step 504, a dielectric layer 610 can be deposited over a first conductive layer 608. Such a step can form a dielectric of a built-in capacitor. Such a step may preferably include the deposition of a relatively thin layer of silicon nitride. Such a silicon nitride layer can have a thickness within a range of about 20 Å to about 300 Å, preferably about 80 Å. A resulting capacitor structure can include a first conductive layer 608 as one terminal (or electrode or plate) and dielectric layer 610 as a capacitor dielectric for resulting capacitor structures.

A dielectric of deposited silicon nitride may be easily incorporated into a manufacturing process, and provide a high dielectric constant. However, the present invention should not necessarily be construed as being limited to such a material.

A method 500 may further include depositing a second conductive layer (step 506).

Figure 6C:
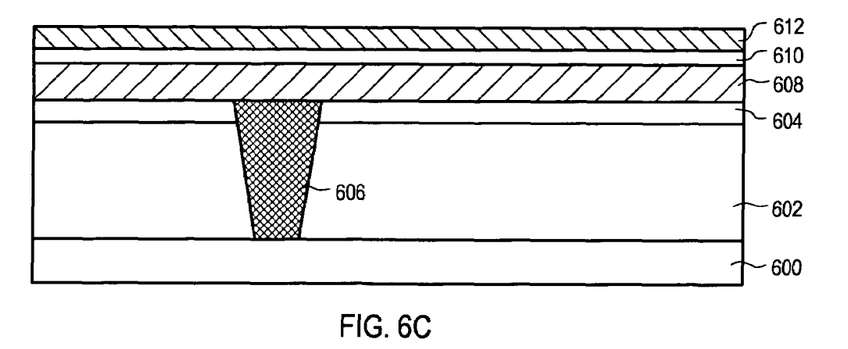

Referring to FIG. 6C, following a step 506, a second conductive layer 612 can be formed over dielectric layer 610. Such a step can form a second terminal for resulting capacitor structures, and in addition, may be commonly patterned with first conductive layer 608 and dielectric layer 610 to form a first interconnect wiring that connects circuit elements to one another. In the particular example shown, a second conductive layer 612 can include titanium (Ti) deposited to a thickness within a range of about 80 Å to about 1500 Å, but preferably to about 300 Å. Of course, a second conductive layer 612 should not necessarily be construed as being limited to any particular material.

Once a first conductive layer, dielectric layer and second conductive layer have been deposited, such layers may be etched to form a first interconnect wiring (step 508).

Figure 6D:
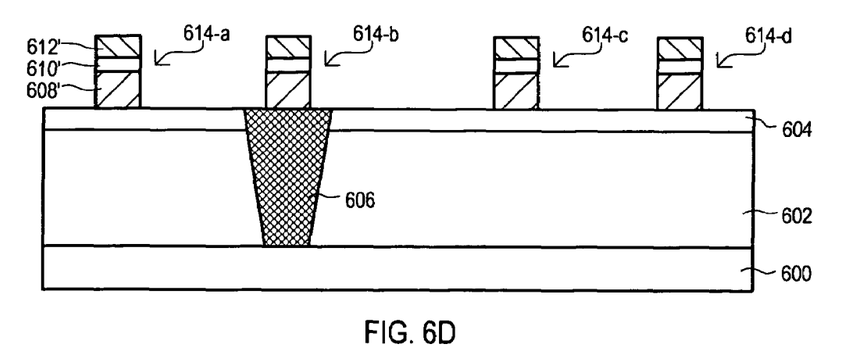

Referring to FIG. 6D, following a step 508, a first conductive layer 608, dielectric layer 610 and second conductive layer 612 can be etched through to expose a cap insulating layer 604 and form a first interconnect wiring. Such a wiring can include a number of segments, four of which are shown as 614-a, 614-b, 614-c and 614-d. Such an interconnect wiring (614-a, 614-b, 614-c and 614-d) can provide electrical connection to/between circuit elements. For example, segment 614-b is shown connected to substrate 600 by LI contact 606.

However, unlike conventional interconnect wiring, first interconnect wiring segments (614-a, 614-b, 614-c and 614-d) can also form individual capacitor structures. For example, wiring segment 614-a can form a capacitor structure having a first conductive layer portion 608' as one plate, a dielectric layer portion 610' as a capacitor dielectric, and a second conductive layer portion 612' as another plate. In one very particular embodiment, two of these structures can be connected in series to form one effective capacitance per SRAM cell, as will be described below.

After the formation of a first interconnect wiring, an insulating sidewall layer can be deposited over a first interconnect wiring (step 510). Such a step can include depositing a layer of silicon nitride with a thickness in the range of 100 Å to 3500 Å, preferably about 500 Å. Of course, the present invention should not necessarily be construed as limiting a sidewall layer to any particular material.

After depositing an insulating sidewall layer, such a layer can be anisotropically etched (step 512).

Figure 6E:
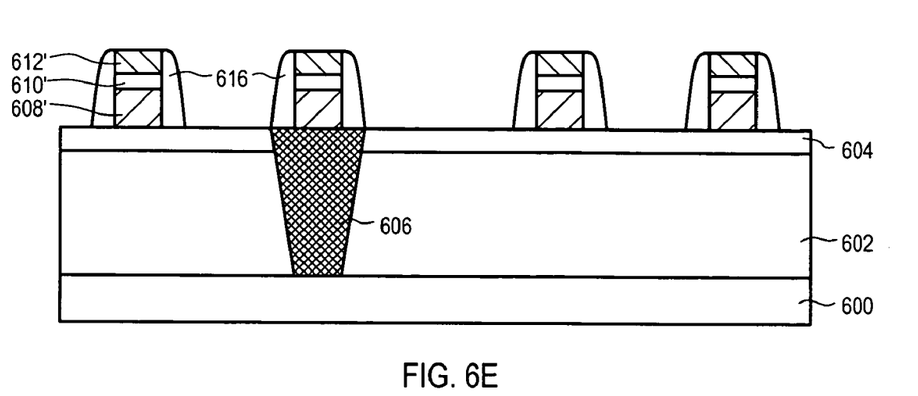

Referring to FIG. 6E, following a step 512, insulating spacers (two of which are shown as 616) can be formed on side surfaces of first interconnect wiring segments (614-a, 614-b, 614-c and 614-d). Spacers (e.g., 616) can be formed in order to guard against possible shorts between first conductive layer portions (e.g., 608') and second conductive layer portions (612'). It is noted that in the example shown, a second conductive layer portion (e.g., 612') of each first interconnect wiring segment can be exposed following a step 512.

An interlayer insulating film can then be formed over a first interconnect wiring (step 514).

Figure 6F:
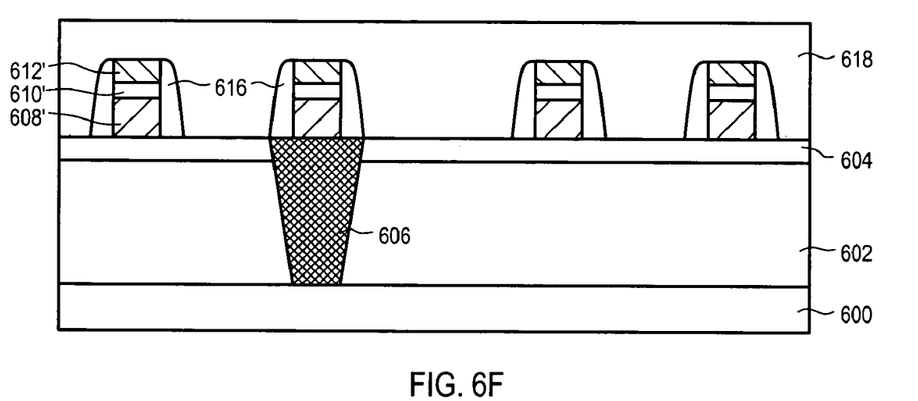

Referring to FIG. 6F, following a step 514, an interlayer insulating film 618 may cover first interconnect wiring (614-*a*, 614-*b*, 614-*c* and 614-*d*). Such a step may include depositing a layer of silicon oxide having a thickness in the range of about 500 Å to about 15000 Å, preferably about 3000 Å. Such a step may further include planarizing the deposited interlayer insulating film. Preferably, a chemical mechanical polish (CMP) step can form a substantially flat top surface on interlayer insulating film 618.

A method 500 may then include removing a portion of the interlayer insulating film to form a recess and expose a second conductive layer (step 516).

Figure 6G:
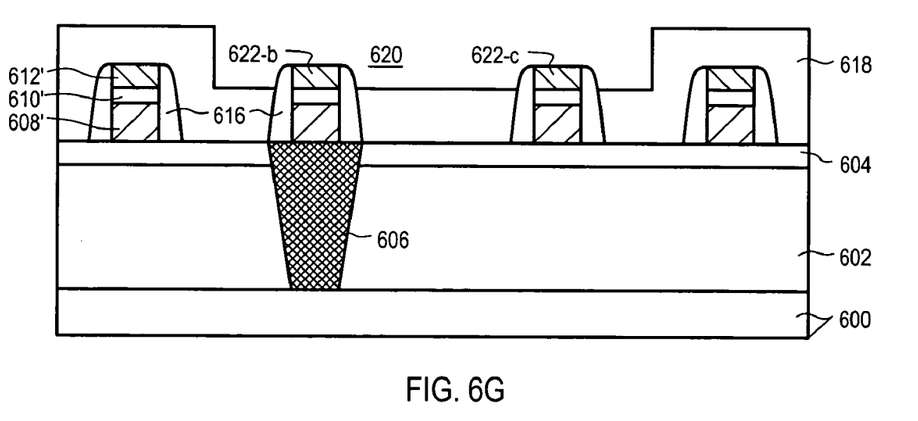

Referring to FIG. 6G, a semiconductor device following a step 516 is shown. Such a step can include etching with a capacitor open mask. A capacitor open mask can define an area for a subsequently formed capacitor plate portion. After etching, a recess 620 can be formed within interlayer insulating film 618 that exposes second conductive layer portions 622-*b* and 622-*c* of selected first interconnect wiring segments. As but one example, a step 516 can include an oxide etch performed to stop on second conductive layer portions (622-*b* and 622-*c*). It is noted that spacers 612 can prevent first conductive layer portions (e.g., 608') from being exposed.

A third conductive layer may then be deposited (step 518).

Figure 6H:
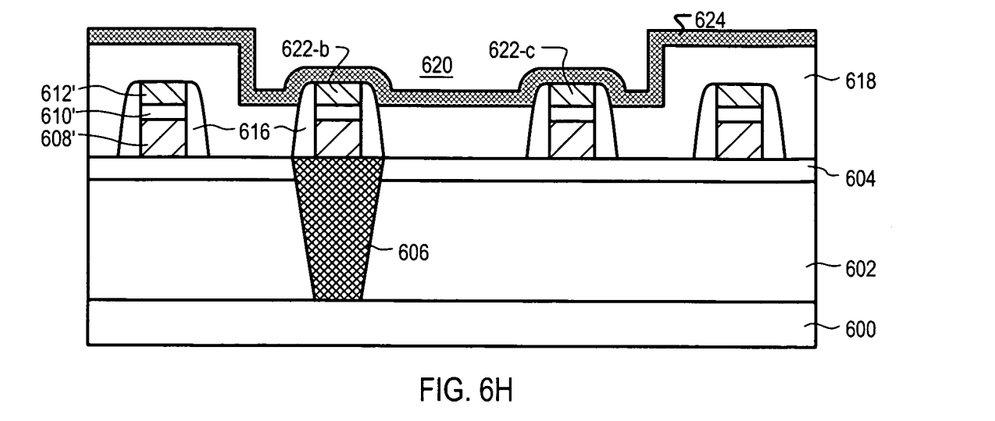

FIG. 6H shows a semiconductor device following a step 518. A third conductive layer 624 can be formed over interlayer insulating film 618, including within recess 620. Such a step can include depositing a layer of Ti to a thickness of within the range of about 50 Å to about 1000 Å, preferably about 200 Å. A third conductive layer 624 should not be construed as being limited to any particular material. Further, portions of a third conductive layer 624 not serving as a capacitor plate may interconnect other circuit elements (by way contacts, vias or the like).

In the example of FIG. 6H, the illustrated third conductive layer 624 can provide a common electrical connection between two capacitor structures (614-*b* and 614-*c*). Accordingly, in this example, a third conductive layer 624 can form an intermediate node of two series-connected capacitor structures 614-*b* and 614-*c*.

A method 500 can include a CMP step that removes portions of the third conductive layer outside of recess 620 (step 520).

Figure 6I:
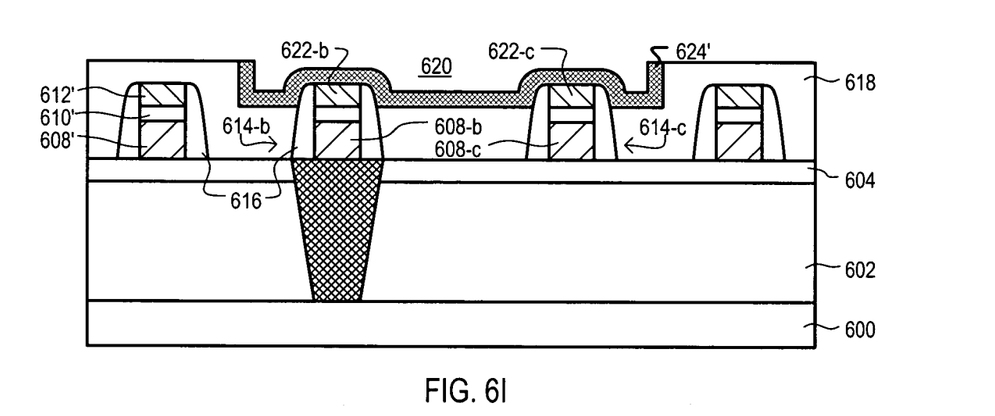

A semiconductor device following a step 520 is shown in FIG. 6I. Such a CMP step can further isolate a resulting portion of third conductive layer, to thereby form a capacitor plate portion 624'. A CMP polishing step can include the removal of about of 200 Å to about 4000 Å, preferably about 800 Å. In this way, a resulting capacitor plate portion 624' can be self-aligned with respect to the capacitor open mask. In one particular configuration, second conductive layer portions (622-*b* and 622-*c*) can be connected through resulting capacitor plate portion 624' to form an intermediate node of a built in capacitor, while corresponding first conductive layer portions (608-*b* and 608-*c*) can form connections to the SRAM cell storage nodes.

Next, an interlayer dielectric can be deposited (step 522).

Figure 6J:
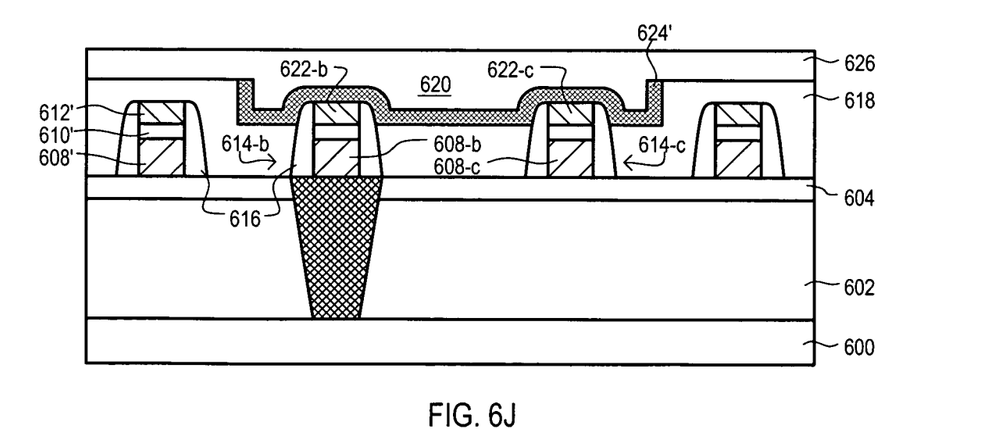

As shown in FIG. 6J, a step 522 can result in an interlayer dielectric 626 that covers capacitor plate portion 624', and thus insulates the structure from overlying conductive layers. An interlayer dielectric 626 may be deposited silicon oxide having a thickness in the range of about 40 Å to about 1000 Å, preferably about 200 Å. After being deposited, an interlayer dielectric 626 could be subject to a planarization step.

Figure 6K:
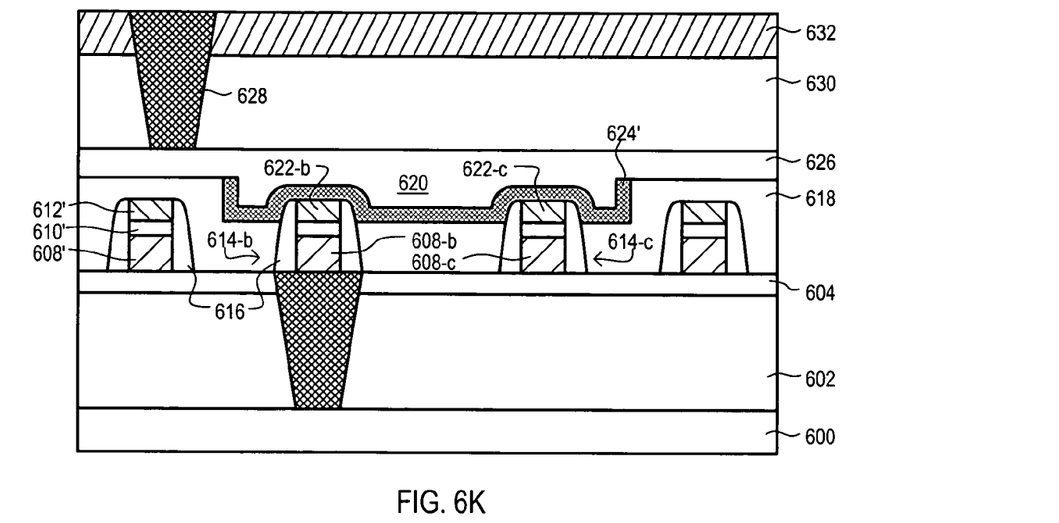

As represented by FIG. 6K, a semiconductor device can be further processed to form additional interconnection layers and/or structures. FIG. 6K shows the formation of upper layers through which a metal contact 628 may be formed. As but one example, such upper layers can include a layer of silicon nitride 630 and a layer of titanium 632. Even more particularly, a layer of silicon nitride can be deposited to a thickness of about 20 Å to about 300 Å, preferably about 80 Å. This can be followed by the deposition of layer of titanium having a thickness of about 80 Å to about 1500 Å, preferably about 300 Å. A contact etch mask can then be formed, followed by a contact etch step which can form an opening through layers 630 and 632. Metal contact 628 may then be formed within a resulting opening.

Subsequent conventional processing steps may then be followed to complete a semiconductor device.

In one particular arrangement, a soft-error rate for a semiconductor device may be reduced including an additional rectangular capacitor layer can be included by patterning a third conductive layer according to a capacitor mask pattern. Such a patterned third conductive layer can be aligned with lower local interconnect layers to thereby form a built-in capacitor. One particular example of such an arrangement is shown in FIGS. 7A and 7B.

Figure 7A:
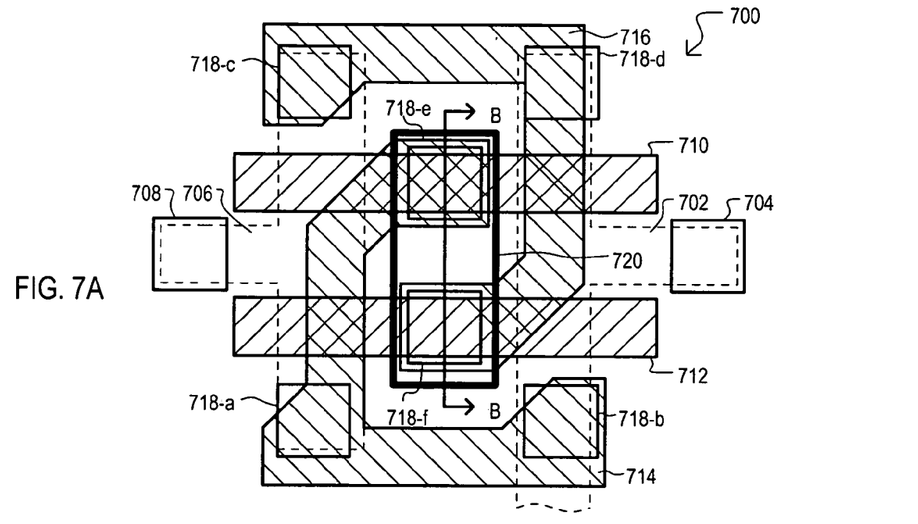
FIG. 7A is a top plan view showing the layout of a static random access memory (SRAM) cell according to one particular embodiment of the present invention.
Figure 7B:
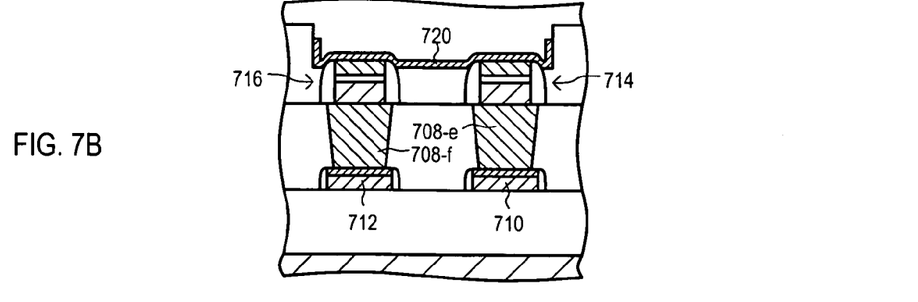
FIG. 7B is a side cross sectional view taken along line B-B of FIG. 7A.

FIG. 7A is top plan view showing different integrated circuit layers of a six transistor SRAM cell. FIG. 7B is a side cross sectional view taken along line B-B of FIG. 7A.

FIG. 7A illustrates a six transistor SRAM cell 700 that includes a first active region 702 connected to a low power supply contact 704, and a second active region 706 connected to a high power supply contact 708. A first gate layer portion 710 is formed over the active regions (702 and 706) to thereby form n-channel and p-channel transistors of one inverter. Similarly, a second gate layer portion 712 is formed over the active regions (702 and 706) to thereby form n-channel and p-channel transistors of another inverter.

FIG. 7A also includes a first interconnect wiring including wiring portions 714 and 716. Such wiring portions can "cross-couple" the inverters of the SRAM cell 700 by way of local contacts 718-*a* to 718-*f*. Unlike conventional SRAM configurations, wiring portions 714 and 716 can have a structure that includes at least a bottom conductive layer and top conductive layer separated by a dielectric, as opposed to only one or more conductive layers.

FIG. 7A further shows, by way of darkened outline, a capacitor plate portion 720, which in this particular example has a rectangular shape. A capacitor plate portion 720 can be formed over, and in contact with a top conductive layer of wiring portions 714 and 716.

FIG. 7B illustrates an electrical connection between a capacitor plate portion 720 and a top conductive layer of wiring portions 714 and 716. FIG. 7B also shows connection of wiring portions 714 and 716 to gate layer portions 710 and 712, respectively, by way of local contacts 718-*e* and 718-*f*.

In this way, a capacitor structure can be incorporated into an SRAM memory cell, and thereby reduce a soft-error rate (SER).

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory cell, comprising:
a first node for storing a first potential;
a second node for storing a second potential;
transistor gate electrodes formed from a gate layer; and
a capacitor having plates coupled between the first node and second node, a portion of one plate of the capacitor comprising a first interconnect wiring pattern that includes a plurality of conductive layers commonly etched into the same pattern with substantially aligned edges.

2. The memory cell of claim 1, further comprising:
a first inverter having an input coupled to the first node and an output coupled to the second node; and
a second inverter having an input coupled to the second node and an output coupled to the first node; wherein
the first node stores a true data value and the second node stores a complementary data value.

3. The memory cell of claim 1, further including:
a first access transistor coupled to the first node; and
a second access transistor coupled to the second node.

4. The memory cell of claim 1, wherein:
the first interconnect wiring pattern includes a plurality of separate portions, each portion including bottom conductive layer, a dielectric layer formed over the bottom conductive layer, and a top conductive layer formed over the dielectric layer, the bottom conductive layer forming at least a portion of a first plate of the capacitor, the bottom conductive layer, dielectric layer, and top conductive layer having the same pattern.

5. The memory cell of claim 4, further including:
a second conductive interconnect wiring formed over the first interconnect wiring pattern that forms at least a portion of a second plate of the capacitor.

6. The memory cell of claim 5, wherein:
the second conductive interconnect wiring comprises titanium;
the bottom conductive layer comprises titanium nitride; and
the top conductive layer comprises titanium.

7. The memory cell of claim 1, wherein:
the gate layer is not in physical contact with a drain of any transistor of the memory cell.

8. The memory cell of claim 1, wherein:
the first interconnect wiring pattern includes
a first portion of the first interconnect wiring comprising a bottom conductive layer formed below a dielectric layer that isolates the bottom conductive layer from a top conductive layer, the bottom conductive layer electrically connecting drains of a first and second transistor of the memory cell.

9. A memory cell, comprising:
a first data storage node;
a second data storage node;
a capacitor comprising a first plate coupled to the first data storage node, a second plate coupled to the second data storage node, and a third plate separated from the first and second plates by a capacitor dielectric; and
a plurality of wiring portions, each comprising a commonly patterned first conductive layer and dielectric layer, a first wiring portion forming the first plate and a second wiring portion forming the second plate, the dielectric layer forming the capacitor dielectric.

* * * * *